(12) United States Patent
Nakano

(10) Patent No.: US 7,885,322 B2
(45) Date of Patent: Feb. 8, 2011

(54) JITTER MEASURING CIRCUIT

(75) Inventor: Toshihiko Nakano, Tokyo (JP)

(73) Assignee: NEC Corporation, Tokyo (JP)

( * ) Notice: Subject to any disclaimer, the term of this patent is extended or adjusted under 35 U.S.C. 154(b) by 984 days.

(21) Appl. No.: 11/730,312

(22) Filed: Mar. 30, 2007

(65) Prior Publication Data
US 2007/0230551 A1 Oct. 4, 2007

(30) Foreign Application Priority Data
Mar. 31, 2006 (JP) .............................. 2006-097785

(51) Int. Cl.
*H04B 3/46* (2006.01)
(52) U.S. Cl. ...................................... 375/226
(58) Field of Classification Search ................. 375/226, 375/373, 374, 375, 376; 327/153, 156, 157, 327/158
See application file for complete search history.

(56) References Cited

U.S. PATENT DOCUMENTS

| | | | |
|---|---|---|---|
| 6,445,229 B1 * | 9/2002 | Schenck et al. | ............. 327/116 |
| 6,456,109 B2 | 9/2002 | Urushiyama | |
| 2008/0122498 A1 * | 5/2008 | Furukawa | .................... 327/115 |
| 2009/0051396 A1 * | 2/2009 | Shimamoto | ................. 327/153 |

FOREIGN PATENT DOCUMENTS

JP 2001-309312 11/2001

* cited by examiner

*Primary Examiner*—Chieh M Fan
*Assistant Examiner*—Jaison Joseph
(74) *Attorney, Agent, or Firm*—Young & Thompson

(57) ABSTRACT

A jitter measuring circuit that is capable of measuring the amount of clock jitter and the amount of logic circuit delay jitter separately is provided. The jitter measuring circuit comprises a variable logic delaying section, a data holding section and a controller. The data holding section outputs predetermined data whenever a delay time of the variable logic delaying section is within a time period equivalent to one clock cycle. While the controller changes a delay time of the variable logic delaying section, it observes whether the data holding section outputs expected data and finds a marginal delay time which represents the amount of jitter. If the jitter measuring circuit operates on a power supply without power supply noise, the measured jitter has component of the clock signal only, and if it operates on a power supply with power supply noise, the jitter contains components of the clock signal plus the logic delay time variation.

8 Claims, 3 Drawing Sheets

JITTER MEASURING CIRCUIT

BACKGROUND OF THE INVENTION

1. Field of the Invention

The present invention relates to a jitter measuring circuit and, in particular, to a jitter measuring circuit that enables a user to measure jitter of a clock signal.

2. Description of the Related Art

A jitter characteristic of clocks used in digital circuits, known as cycle-to-cycle jitter, is becoming important in these years. Cycle-to-cycle jitter is the difference in length between successive clock cycles or deviation of clock cycle among successive clock signals. Unlike period jitter, which is defined as the variation of each absolute value of period compared with a reference clock signal, cycle-to-cycle jitter is defined as relative difference between successive clock cycles or deviation of clock cycle among successive clock signals. A technique for detecting cycle-to-cycle jitter is described in Japanese Patent Application Laid-Open No. 2001-309312. According to the technique, a plurality of phase-difference detecting circuits are used to detect the phase difference between a clock signal to be measured and a reference clock signal, and each of phase-difference detecting circuits has different characteristics of phase-difference detection time periods respectively. Variations in the phase differences detected by each of the phase difference detecting circuits are found to detect cycle-to-cycle jitter.

As LSI manufacturing processes become finer, the package density of LSIs is becoming increasingly higher and so are operating frequencies these years. A detrimental effect of the increasingly finer processes is increase of power consumption in LSIs. Another problem is malfunctions or performance degradation due to power supply noise. The power supply noise is generated by variations in power supply potential caused by current ON/OFF by operation of logic circuits that are operating in synchronization with clocks. In order to reduce consumption current, so-called clock gating is generally used that deactivates the clocks in logic circuits that are not performing operation processing. Although the technique is typically effective for reducing power consumption, it tends to increase power supply noise, which can cause malfunctions compared with cases where clock gating is not used, because current significantly changes each time clocks are deactivated and reactivated.

Power supply noise can cause malfunctions and performance degradation of circuits because of:
(1) increase of clock jitter, and
(2) increase of delay jitter in the logic circuits themselves.

These factors cause timing violations in the circuits. The factors (1) and (2) cannot be measured by the existing techniques. Therefore, in conventional circuit design methods, the factors (1) and (2) caused by power supply noise are empirically predicted and circuits are designed by allowing for these factors as design margins. Large margins must be set to avoid timing violations because the amounts of jitter cannot be known and the excessive margins have degraded the performance of LSIs.

The technique disclosed in Japanese Patent Application Laid-Open No. 2001-309312 detects cycle-to-cycle jitter. However, the technique does not measure the amount of the jitter. The technique compares a clock signal to be measured against a reference signal using a plurality of phase-difference detecting circuits. However, the technique does not take into consideration the influence of power supply noise on the reference signal. To detect jitter of a clock signal to be measured caused by power supply noise, the influence of power supply noise must be removed from the reference clock signal, which removal is difficult to implement. Furthermore, the technique disclosed in Japanese Patent Application No. 2001-30931 does not distinguish between the factors (1) and (2). Therefore, the amount of jitter caused by each factor cannot be determined.

SUMMARY OF THE INVENTION

An object of the present invention is to provide a jitter measuring circuit that solves the problem with the conventional art and is capable of measuring the amount of cycle-to-cycle jitter.

Another object of the present invention is to provide a jitter measuring circuit capable of separately measuring the amount of clock jitter and the amount of delay jitter in a logic circuit in addition to achieving the object stated above.

In a jitter measuring circuit according to the present invention, a variable logic delaying section inverts and delays an output from a data holding section and then returns it to the input of the data holding section. The data holding section outputs data inverted in every clock cycle whenever the delay time of the variable logic delaying section is within a time period equivalent to one clock cycle. However, if there is a variation in the length of the clock cycle due to jitter, the clock cycle becomes longer than delay time of the variable logic delaying section at a certain time point and data inversion no longer occurs at an expected time point. A jitter assessing section determines whether the data holding section outputs expected data that is determined by the delay time of the variable logic delaying section and the clock cycle. While changing the delay time of the variable logic delaying section, a controller obtains the marginal delay time of the variable logic delaying section that surely causes the data holding section to output expected data as the amount of cycle-to-cycle jitter of the clock signal.

The jitter measuring circuit of the present invention may further include a logic delay measuring section which generates a signal for measuring the delay time of the variable logic delaying section. The logic delay measuring section may be a circuit that oscillates at a frequency that depends on the delay time of the variable logic delaying section. In this case, the delay time of the variable logic delaying section can be measured by observing the periods of a signal generated by the logic delay measuring section.

The jitter measuring circuit, of the present invention includes first and second jitter measuring sections. The first jitter measuring section may operate on a power supply that does not generate power supply noise and the second jitter measuring section may operate on a power supply that generates power supply noise. Since the first jitter measuring section operates on a stabilized power supply that does not generate power supply noise, the marginal delay time measured by the controller only contains cycle-to-cycle jitter of the clock signal. On the other hand, a variable logic delaying section of the second jitter measuring section is affected by power supply noise and the marginal delay time measured by the controller contains component of the clock signal and the amount of a variation in the logic circuit. It means that the amount of jitter measured using the first jitter measuring section represents the amount of jitter of the clock signal and the amount of jitter measured using the second jitter measuring section represents the amount of jitter of the clock signal plus the amount of a logic delay time variation. Thus, a jitter component of the clock signal and the amount of a variation in the logic circuit can be calculated from the amount of jitter measured by using the first jitter measuring section and the amount of jitter measured by using the second jitter measuring section.

BRIEF DESCRIPTION OF THE DRAWINGS

Exemplary features and advantages of the present invention will become apparent from the following detailed description when taken with the accompanying drawings in which.

DESCRIPTION OF THE EXEMPLARY EMBODIMENT

An embodiment of the present invention will be described with reference to the accompanying drawings.

Basic concept of the present invention is that two jitter measuring sections are provided, and one measures summative pure cycle-to-cycle jitter for clock cycles and the other measures summative cycle-to-cycle jitter for clock cycles including delay jitter in the logic circuits. And also both jitter measuring sections share a data holding section to be used commonly. The pure cycle-to-cycle jitter is measured by the former jitter measuring section, and the delay jitter is obtained by subtracting the pure cycle-to-cycle jitter from the measured result by the latter jitter measuring section.

Figure 1:
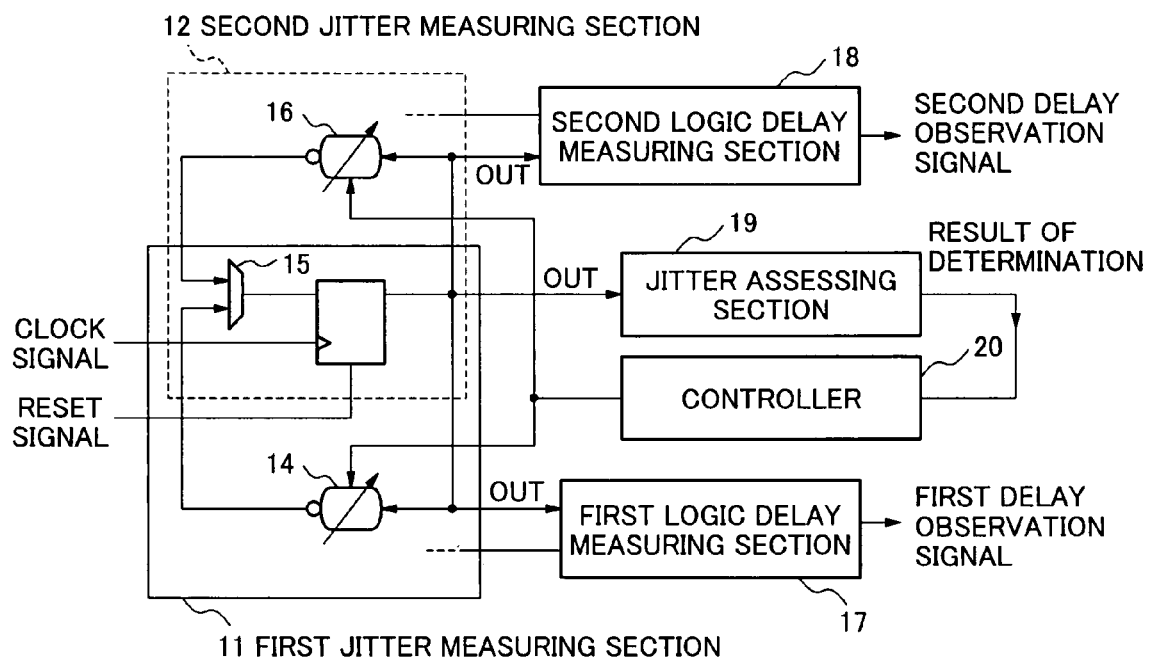
FIG. 1 is a circuit block diagram showing a configuration of a jitter measuring circuit according to one embodiment of the present invention.

FIG. 1 is a circuit block diagram showing a configuration of a jitter measuring circuit according to one embodiment of the present invention.

The jitter measuring circuit 10 comprises a first jitter measuring section 11 and a second jitter measuring section 12. The first jitter measuring section 11 includes a first variable logic delaying section 14, a selector 15 and a data holding section 13, and the second jitter measuring section 12 includes a second variable logic delaying section 16, the selector 15 and the data holding section 13, i.e., the selector 15 and the data holding section 13 are shared by both of first and second jitter measuring sections 11 and 12.

The data holding section 13 latches data in accordance with an input clock signal. The first variable logic delaying section 14 delays an output from the data holding section 13 by a delay time that is variably set, inverts the output logic, and outputs it to the selector 15. The second variable logic delaying section 16 delays an output from the data holding section 13 by a delay time that is variably set, inverts the output logic, and outputs it to the selector 15.

The first variable logic delaying section 14 operates on power supplied from a stabilized power source, not shown, and its delay time is not affected by power supply noise and is therefore stable. However, the second variable logic delaying section 16 operates on power supplied from a normal power supply that is not stabilized and its delay time varies under the influence of power supply noise.

Therefore, the first jitter measuring section 11 is used to measure pure cycle-to-cycle jitter and the second jitter measuring section 12 is used to measure the cycle-to-cycle jitter including the delay jitter as mentioned above.

In addition to those jitter measuring sections, the jitter measuring circuit 10 comprises a first logic delay measuring section 17, a second logic delay measuring section 18, a jitter assessing section 19, and a controller 20. The jitter measuring circuit 10 may be provided on an LSI such as a processor or a chip set of a high clock frequency on the order of gigahertz or higher, for example.

The selector 15 selects one of an output from the first variable logic delaying section 14 and an output from the second variable logic delaying section 16 as an input in accordance with an instruction from the controller 20, and outputs it to the data holding section 13. Data latched by the data holding section 13 depends on the length of clock cycle, which is the time period between a rising edge of a clock signal and the next rising edge, and a delay time given by the first variable logic delaying section 14 or the second variable logic delaying section 16. The data holding section 13 latches input data and outputs the inverse of the previously latched data if the delay time given by the first variable logic delaying section 14 or the second variable logic delaying section 16 is shorter than the time period between a rising edge of the clock signal and the next rising edge, i.e., the length of clock cycle.

The jitter assessing section 19 determines from the output from the data holding section 13 whether the data holding section 13 is holding expected data, and outputs the result of the determination. The controller 20 instructs the first variable logic delaying section 14 or the second variable logic delaying section 16 to adjust the delay time to be given on the basis of the result of determination output from the jitter assessing section 19.

The first logic delay measuring section 17 outputs a first logic delay observation signal for measuring the delay time given by the first variable logic delaying section 14. The second logic delay measuring section 18 outputs a second logic delay observation signal for measuring the delay time given by the second variable logic delaying section 16.

Operation of the jitter measuring circuit 10 will be described.

The controller 20 first causes the selector 15 to select the first jitter measuring section 11 and to input an output from the first variable logic delaying section 14 into the data holding section 13. This is to measure pure cycle-to-cycle jitter. The controller 20 inputs a reset signal to the data holding section 13, sets the delay time of the first variable logic delaying section 14 to its initial value, and activates the first jitter measuring section 11. The controller 20 changes the delay time of the first variable logic delaying section 14 and refers to the result of determination output from the jitter assessing section 19 to determine whether data output from the data holding section 13 is expected data.

Figure 2:
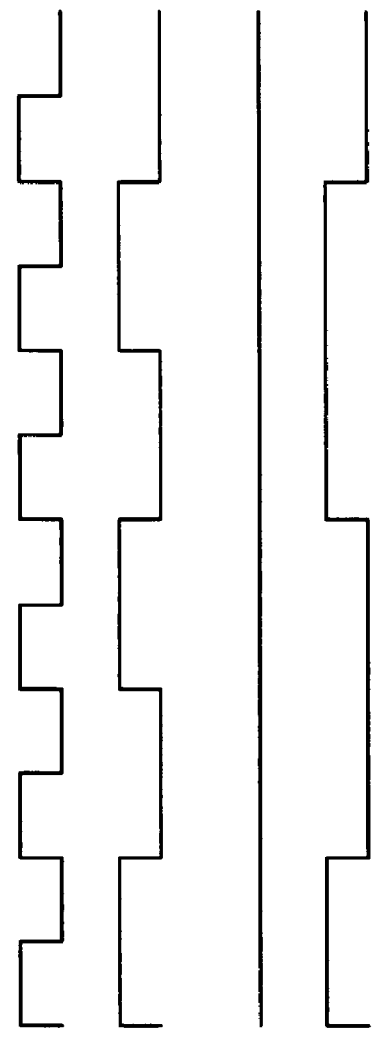
FIG. 2A to FIG. 2D is a waveform diagram showing a clock signal and an output from a data holding section.

FIG. 2 is a waveform diagram showing a clock signal and an output from the data holding section 13. When the delay time given by the first variable logic delaying section 14 is sufficiently shorter than the period of the clock signal (or clock cycle) shown in FIG. 2A, the inverse of the logic of the previously latched data is returned to the input of the data holding section 13 by the time of the next rising edge of the clock signal through the first variable logic delaying section 14. Accordingly, the output from the data holding section 13 is inverted at every rising edge of the clock signal as shown in FIG. 2B.

On the other hand, when the delay time given by the first variable logic delaying section 14 is longer than the clock cycle, the inverse of the logic of the previously latched data is not returned to the input of the data holding section 13 by the time of the next rising edge of the clock signal. Accordingly, the output from the data holding section 13 is data without variations as shown in FIG. 2C.

If the delay time given by the first variable logic delaying section 14 is pretty close the clock cycle, due to the influence of jitter of the clock signal, the data holding operation becomes marginal. For example, the inverted signal of the previously latched data may be returned to the input of the data holding section 13 by the time of a rising edge of the clock signal and thus the data is inverted, however, at another rising edge, the inverted signal of the previously latched data may not be returned to the input of the data holding section 13 by the time of the rising edge of the clock signal and therefore the data is not inverted. As a result, the output from the data holding section 13 outputs irregular data as shown in FIG. 2D.

Figure 3:
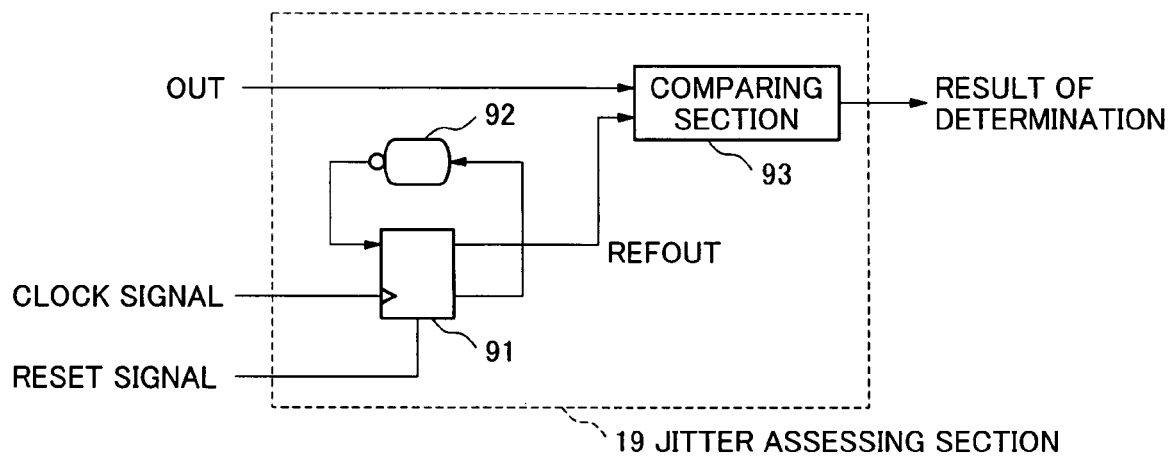
FIG. 3 is a circuit block diagram showing a configuration of a jitter assessing section.

FIG. 3 shows an exemplary configuration of the jitter assessing section 19. The jitter assessing section 19 includes a latch circuit 91, a fixed logic delaying section 92, and a comparing section 93. The latch circuit 91 and the fixed logic delaying section 92 constitute a reference signal generating section. The latch circuit 91 latches data in accordance with a clock signal. The fixed logic delaying section 92 gives a predetermined fixed delay time to an output from the latch circuit 91, inverts the output logic, and returns it to the input of the latch circuit 91.

The fixed logic delaying section 92 gives a delay time sufficiently shorter than the period of the clock signal or clock cycle) so that the inverse of data latched by the latch circuit 91 at a rising edge is returned to the input of the latch circuit 91 by the next rising edge of the clock signal by taking into account jitter of the clock signal and a variation in the delay time of the fixed logic delaying section 92. Since the delay time of the fixed logic delaying section 92 is set in this manner, the fixed logic delaying section 92 does not need to use a stabilized power source.

Because the delay time of the fixed logic delaying section 92 of the jitter assessing section 19 is set to a time sufficiently shorter than the clock cycle, a signal REFOUT output from the latch circuit 91 is inverted at every rising edge of the clock signal as in FIG. 2B. The output signal REFOUT from the latch circuit 91 and output OUT from the data holding section 13 can be compared with each other by a comparing section 93 to determine whether the output OUT from the data holding section 13 is expected data, that is, data inverting at every clock cycle. The comparing section 93 can be readily implemented by an exclusive OR gate, detailed description of the circuit configuration of which will be omitted.

The controller 20 inputs a reset signal in the data holding section 13 and the latch circuit 91 of the jitter assessing section 19 at the same time. If the output OUT from the data holding section 13 is inverted at every rising edge of the clock signal as shown in FIG. 2B, the comparing section 93 outputs the result of comparison indicating that the output OUT from the data holding section 13 matches the output REFOUT of the latch circuit 91. If the comparing section 93 continues outputting the result of comparison indicating a match for a predetermined period of time, it can be determined that the output OUT from the data holding section 13 is data inverting at every rising edge of the clock signal.

If the comparing section 93 of the jitter assessing section 19 continues outputting the result of comparison indicating a match for the predetermined time period, the controller 20 instructs the first variable logic delaying section 14 to change the delay time to be given and determines whether the jitter assessing section 19 provides the result of determination indicating a match. This process is repeated to obtain the marginal delay time given by the first variable logic delaying section 14 that surely causes the data holding section 13 to output expected data. That is, the delay time given by the first variable logic delaying section 14 is changed from short to long gradually. And, the maximum delay time, by which the data holding section 13 surely outputs expected data that inverts the data at each rising edge of the clock signal as shown in FIG. 2B, but if only a little longer, the data holding section 13 does not output expected data and outputs irregular data as shown in FIG. 2D, is to be found.

The maximum delay time obtained by the above process theoretically matches the clock cycle if the clock signal does not have jitter. However, under the influence of clock jitter (cycle-to-cycle jitter), it (the obtained maximum delay time) will be shorter than the clock cycle. Since the first variable logic delaying section 14 operates on a stabilized power supply, there is no factors that vary its delay time. Therefore, the amount of clock jitter (cycle-to-cycle jitter) can be calculated from the difference between the maximum delay time and the clock cycle with taking into account the set-up time and delay time of the data holding section 13.

Next, the controller 20 causes the selector 15 to select the second jitter measuring section 12 to allow an output from the second variable logic delaying section 16 to be input in the data holding section 13. This is to measure cycle-to-cycle jitter including delay jitter in the logic circuits.

The controller 20 inputs a reset signal in the data holding section 13, instructs the second variable logic delaying section 16 to set the delay time to its initial value, and activates the second jitter measuring section 12. The controller 20 instructs the second variable logic delaying section 16 to change the delay time and refers to the result of determination output from the jitter assessing section 19 to determine whether data output from the data holding section 13 is expected data.

The controller 20 obtains the maximum delay time given by the second variable logic delaying section 16 that inverts the output from the data holding section 13 at each rising edge of the clock signal in a manner similar to that in the first jitter measuring section 11. Since the second variable logic delaying section 16 does not operate on a stabilized power supply, its delay time has jitter components produced by power supply noise. Accordingly, the obtained maximum delay time of the second variable logic delaying section 16 is a value affected by both of clock jitter and delay jitter that is caused by power supply noise. Therefore, the sum of the amount of clock jitter and the logic delay jitter can be calculated from the difference between the maximum delay time and the clock cycle.

Figure 4:
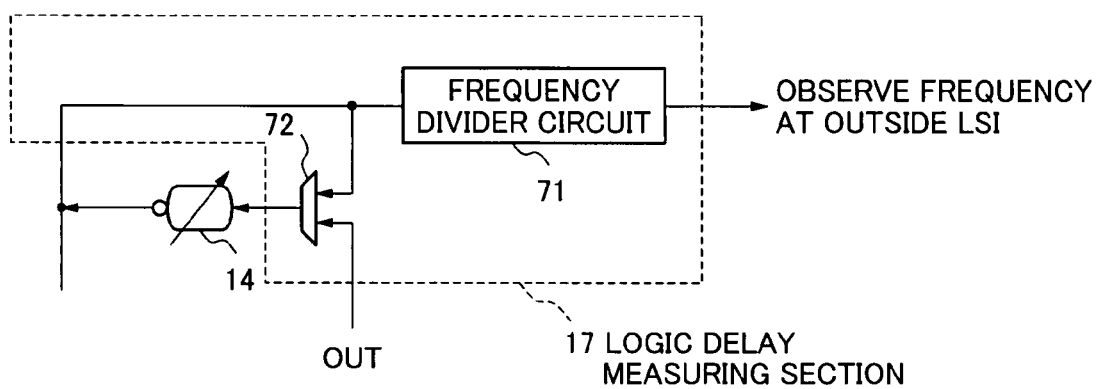
FIG. 4 is a circuit block diagram showing a configuration of a logic delay measuring section.

FIG. 4 shows a configuration of a logic delay measuring section. While a configuration of the first logic delay measuring section 17 is shown in FIG. 4, the second logic delay measuring section 18 has the same configuration as the first logic delay measuring section 17 except that the first variable logic delaying section 14 is replaced with the second variable logic delaying section 16. The first logic delay measuring section 17 has a frequency divider circuit 71 and a selector 72. The selector 72 selects the output of the data holding section 13 when adjusting the delay time of the first variable logic delaying section 14. After the completion of adjustment of the delay time, the selector 72 selects the output of the first variable logic delaying section 14 and returns the output from the first variable logic delaying section 14 to its input, thereby forming a loop path.

The first variable logic delaying section 14 delays an input signal by the adjusted delay time and outputs the inversion of its logic. Consequently, the loop path formed by the first variable logic delaying section 14 oscillates at a frequency according to the delay time of the first variable logic delaying section 14 like a ring oscillator. The frequency divider circuit 71 divides the oscillating frequency of the loop path formed by the first variable logic delaying section 14 by a predetermined frequency division ratio and outputs the result to outside the LSI. By measuring the frequency of a signal output from the frequency divider circuit 71 at outside the LSI, the adjusted delay time of the first variable logic delaying section 14 can be calculated. An adjusted delay time of the second variable logic delaying section 16 is calculated in a similar manner.

According to the embodiment, an output from the data holding section 13, which latches data in accordance with a clock signal, is delayed and its logic is inverted at the first or second variable logic delaying section 14, 16, and is then returned to the input of the data holding section 13. The controller 20 confirms the output of the jitter assessing section 19, which determines whether the data holding section 13 has output expected data, while adjusting the delay time given by the first or second variable logic delaying section 14, 16 from short to long gradually, and finds the maximum delay time that causes marginal operation of the data holding section 13 to output expected data. The adjusted maximum delay time is measured by using the first or second logic delay measuring section 17, 18. Based on the delay time of the first or second variable logic delaying section 14, 16 thus measured, the amount of accumulated cycle-to-cycle jitter of the clock signal can be calculated.

According to the embodiment, the first variable logic delaying section 14 operates on a stabilized power supply whereas the second variable logic delaying section 16 operates on a normal power supply. Therefore the amount of cycle-to-cycle jitter calculated using the first variable logic delaying section 14 represents the amount of jitter of the clock signal and the amount of jitter calculated using the second variable logic delaying section 16 represents the sum of the amount of jitter of the clock signal and the amount of logic delay jitter of the second variable logic delaying section 16. Thus, the amount of jitter of a clock signal and the amount of logic delay jitter can be calculated from the two jitter amounts. In this way, the amount of clock jitter due to power supply noise and the amount of delay jitter of a logic circuit itself can be separately obtained.

According to the embodiment, the first and second jitter measuring sections 11 and 12 use a common data holding section 13. With this arrangement, the delay time of the first variable logic delaying section 14 and the delay time of the second variable logic delaying section 16 can be directly compared with each other without taking into account variations among devices in the LSI such as the set-up time of the data holding section 13. Thus, the amount of clock jitter can be accurately compared with the amount of logic delay jitter.

While data is latched by the data holding section 13 at the rising edge of a clock signal and the amount of jitter at the rising edge is measured in the embodiments described above, the logic of a clock signal may be inverted and input to a clock terminal of the data holding section 13 and the amount of jitter at the falling edge may be measured. A data holding section that latches data at the rising edge of a clock signal and a data holding section that latches data at the falling edge may be used to measure the amounts of jitter at both of the rising and falling edges of a clock signal may be measured. If the duty ratio of a clock signal is 1:1 and one wants to measure jitter of a half cycle of a clock signal, a data holding section 13 may be configured so as to invert data at every rising edge and falling edge of a clock signal.

While the present invention has been described with respect to preferred embodiments thereof, the jitter measuring circuit of the present invention is not limited to these embodiments. Various modifications and changes to the configurations of the embodiments also fall within the scope of the present invention.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments without the use of inventive faculty. Therefore, the present invention is not intended to be limited to the embodiments described herein but is to be accorded the widest scope as defined by the limitations of the claims and equivalents.

Further, it is noted that the inventor's intent is to refrain all equivalents of the claimed invention even if the claims are amended during prosecution.

What is claimed is:

1. A jitter measuring circuit comprising:
   a jitter measuring section including a data holding section, which latches data in accordance with a clock signal, and a variable logic delaying section, which gives a variable delay time to an output of the data from said data holding section, inverts the logic of the data, and returns the inverted data to an input of said data holding section;
   a jitter assessing section which determines on the basis of an output from said data holding section whether said data holding section outputs predetermined data; and
   a controller which instructs said variable logic delaying section to change the delay time to be given to the output of the data from said data holding section, and obtains on the basis of the result of determination output from said jitter assessing section a marginal value of the delay time given by said variable logic delaying section at which said data holding section can perform a marginal operation to output predetermined data.

2. The jitter measuring circuit according to claim 1, wherein said jitter assessing section determines whether the output from said data holding section is inverted at each rising edge or falling edge of the clock signal.

3. The jitter measuring circuit according to claim 1, wherein said jitter assessing section comprises a reference signal generating section which generates a reference signal whose data inverts on the basis of a rising edge or falling edge of the clock signal and a comparing section which compares the output from said data holding section with said reference signal.

4. The jitter measuring circuit according to claim 3, wherein said reference signal generating section comprises a latch circuit which latches data in accordance with the clock-signal and a fixed logic delaying section which delays an output of data from said latch circuit by a predetermined delay time, inverts the logic of the data, and returns the inverted data to an input of said latch circuit.

5. The jitter measuring circuit according to claim 1, further comprising a logic delay measuring section which generates a signal for measuring a delay time of said variable logic delaying section.

6. The jitter measuring circuit according to claim 5, wherein said logic delay measuring section outputs a periodic signal oscillating at a frequency that is dependent on the delay time of said variable logic delaying section.

7. The jitter measuring circuit according to claim 4, comprising a first jitter measuring section and a second jitter measuring section, wherein said first jitter measuring section operates on a power supply that does not generate power supply noise and said second jitter measuring section operates on a power supply that generates power supply noise.

8. The jitter measuring circuit according to claim 7, wherein said first and second jitter measuring sections share said data holding section, and the jitter measuring circuit further comprises a selector which selectively inputs an output from a variable logic delaying section of said first jitter measuring section and an output from a variable logic delaying section of said second jitter measuring section into said data holding section.

* * * * *